(12) United States Patent
Morishita et al.

(10) Patent No.: US 10,553,390 B2
(45) Date of Patent: Feb. 4, 2020

(54) ELECTRON SOURCE AND PRODUCTION METHOD THEREFOR

(71) Applicant: DENKA COMPANY LIMITED, Chuo-ku, Tokyo (JP)

(72) Inventors: Toshiyuki Morishita, Shibukawa (JP); Hiromitsu Chatani, Shibukawa (JP); Shimpei Hirokawa, Shibukawa (JP); Toshiyuki Ibayashi, Shibukawa (JP); Isao Sugimoto, Shibukawa (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 16/317,640

(22) PCT Filed: Jun. 29, 2017

(86) PCT No.: PCT/JP2017/023933
§ 371 (c)(1),
(2) Date: Jan. 14, 2019

(87) PCT Pub. No.: WO2018/016286
PCT Pub. Date: Jan. 25, 2018

(65) Prior Publication Data
US 2019/0221399 A1  Jul. 18, 2019

(30) Foreign Application Priority Data

Jul. 19, 2016 (JP) .............................. 2016-141785
Mar. 28, 2017 (JP) .............................. 2017-063016

(51) Int. Cl.
*H01J 37/06* (2006.01)
*H01J 1/148* (2006.01)
*H01J 9/04* (2006.01)

(52) U.S. Cl.
CPC .............. *H01J 37/06* (2013.01); *H01J 1/148* (2013.01); *H01J 9/04* (2013.01); *H01J 2209/012* (2013.01)

(58) Field of Classification Search
CPC .............. H01J 37/06; H01J 1/148; H01J 9/04
See application file for complete search history.

(56) References Cited

U.S. PATENT DOCUMENTS 4,486,684 A  12/1984 Hohn
4,486,688 A  12/1984 Schmitz
(Continued)

FOREIGN PATENT DOCUMENTS

JP  53-107460 U  8/1978
JP  55-14646 A  2/1980
(Continued)

OTHER PUBLICATIONS

International Search Report dated Sep. 12, 2017, issued in corresponding International Application No. PCT/JP2017/023933, filed Jun. 29, 2017, 2 pages.

*Primary Examiner* — Anne M Hines
(74) *Attorney, Agent, or Firm* — Christensen O'Connor Johnson Kindness PLLC

(57) ABSTRACT

An electron source capable of suppressing consumption of an electron emission material is provide. The present invention provides an electron source including: an electron emission material; and, an electron emission-suppressing material covering a side surface of the electron emission material, wherein a work function of the electron emission-suppressing material is higher than that of the electron emission material, and a thermal emissivity of the electron emission-suppressing material is lower than that of the electron emission material.

11 Claims, 3 Drawing Sheets

(56) References Cited

U.S. PATENT DOCUMENTS

| | | |
|---|---|---|
| 4,760,306 A | 7/1988 | Leung et al. |
| 2002/0020822 A1 | 2/2002 | Okunuki |
| 2005/0174030 A1 | 8/2005 | Katsap |
| 2014/0097736 A1 | 4/2014 | Katsap |

FOREIGN PATENT DOCUMENTS

| | | |
|---|---|---|
| JP | 57-196444 A | 12/1982 |
| JP | 2000-173900 A | 6/2000 |
| JP | 2005-190758 A | 7/2005 |
| JP | 2005-228741 A | 8/2005 |
| JP | 2009-152645 A | 7/2009 |
| JP | 2012-069364 A | 4/2012 |
| JP | 2014-075336 A | 4/2014 |

100
ELECTRON SOURCE AND PRODUCTION METHOD THEREFOR

TECHNICAL FIELD

The present invention relates to an electron source used in an electron microscope, an electron beam lithography apparatus, a semiconductor photomask plotting apparatus and the like using an electron beam, and a production method thereof.

BACKGROUND ART

Patent documents 1 to 6 and non-patent document 1 disclose a technique for limiting a electron-emitting region by covering a periphery of an electron emission material with graphite material in an electron source, thereby enabling enhancement of luminance and suppression of surplus current.

PRIOR ART DOCUMENTS

Non-Patent Document

[Non-Patent Document 1] Electron Optical Systems (pp. 163-170) SEM Inc., AMF O'Hare (Chicago), IL 60666-0507, U.S. Pat. S. A.

Patent Documents

[Patent Document 1] JP2005-228741A
[Patent Document 2] JP2005-190758A
[Patent Document 3] JP2000-173900A
[Patent Document 4] JP2009-152645A
[Patent Document 5] JP2012-069364A
[Patent Document 6] JP2014-075336A

SUMMARY OF THE INVENTION

Problems to be Resolved by the Invention

When the present inventors investigated the techniques described in the above documents, it was found that, in some conditions, consumption of the electron emission material could not be sufficiently suppressed based on the techniques described in the above documents.

The present invention has been made in view of such circumstances and provides an electron source capable of suppressing consumption of an electron emission material.

Means of Solving the Problems

That is, the present invention adopts the following means in order to solve the above problem.
(1) An electron source including:
   an electron emission material; and,
   an electron emission-suppressing material covering a side surface of the electron emission material,
   wherein a work function of the electron emission-suppressing material is higher than that of the electron emission material, and
   a thermal emissivity of the electron emission-suppressing material is lower than that of the electron emission material.
(2) The electron source according to (1), wherein the electron emission material includes at least one selected from the group consisting of lanthanum boride, cerium boride and iridium cerium.
(3) The electron source according to (1) or (2), wherein the side surface of the electron emission material has a (100) crystal plane at an outer peripheral portion thereof.
(4) The electron source according to any one of (1) to (3), wherein the electron emission-suppressing material includes at least one selected from the group consisting of metallic tantalum, metallic titanium, metallic zirconium, metallic tungsten, metallic molybdenum, metallic rhenium, tantalum carbide, titanium carbide and zirconium carbide.
(5) The electron source according to any one of (1) to (4), wherein an end surface of the electron emission material is on the same plane as an end surface of the electron emission-suppressing material, and a normal to the plane is in a direction of emission of electrons.
(6) The electron source according to any one of (1) to (5), wherein shape of the electron emission-suppressing material is a thin film.
(7) The electron source according to (6), wherein the thin film has a thickness of 0.1 to 2 μm.
(8) The electron source according to any one of (1) to (7), further including a support member around the electron emission-suppressing material.
(9) The electron source according to (8), wherein the support member is closely attached to the electron emission-suppressing material.
(10) The electron source according to (8) or (9), wherein the support member is made of graphite.
(11) A method for manufacturing an electron source according to any one of (1) to (10), including an applying step and a solidifying step,
   wherein, in the applying step, paste containing an electron emission-suppressing material is applied to a side surface of an electron emission material, and
   in the solidifying step, the paste is solidified.
(12) The method according to (11), further including an inserting step between the applying step and the solidifying step, wherein, in the inserting step, the electron emission material having the applied paste is inserted into an opening provided in a support member.

Effect of the Invention

According to the present invention, the consumption of the electron emission material can be suppressed.

DETAILED DESCRIPTION OF THE INVENTION

Figure 1A:
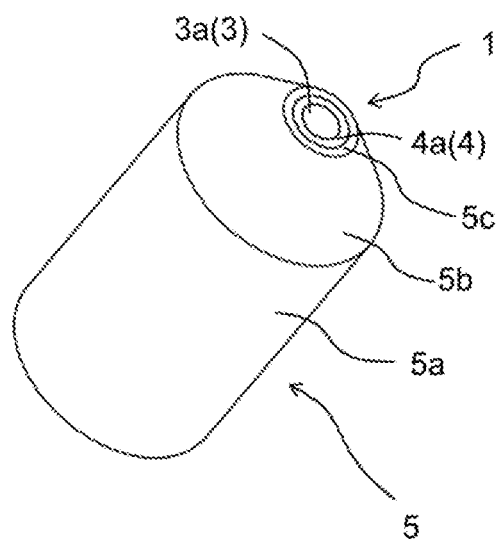
FIG. 1A shows a perspective view of an electron source 1 according to one embodiment of the present invention.
Figure 1B:
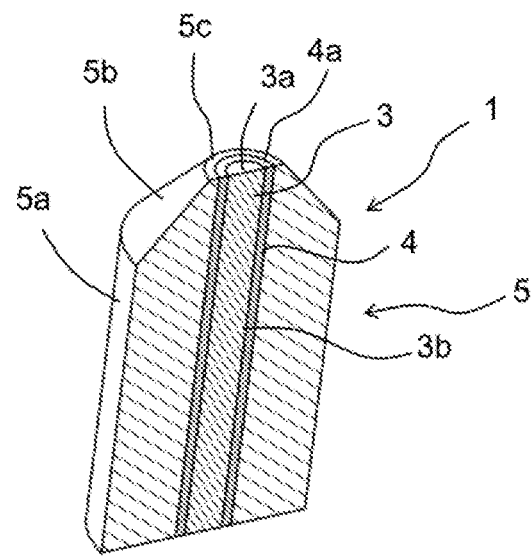
FIG. 1B shows a cross-sectional view of the electron source 1 according to one embodiment of the present invention passing through the center of the electron source 1.

Hereinafter, an example of the present invention will be described with reference to the drawings, but the present invention is not limited thereto.

1. Configuration of Electron Source 1

As shown in FIGS. 1A, 1B to 2A to 2D, an electron source 1 according to an embodiment of the present invention includes an electron emission material 3 and an electron emission-suppressing material 4 covering a side surface 3b of the electron emission material 3. A work function of the electron emission-suppressing material 4 is higher than that of the electron emission material 3. A thermal emissivity of the electron emission-suppressing material 4 is lower than that of the electron emission material 3. Preferably, a support member 5 is provided around the electron emission-suppressing material 4.

The electron source 1 can be used after heating by a heater. Configuration of the heater is not limited as long as it can heat the electron source 1. The heater is, for example, a graphite heater or a tungsten heater. Electrons are emitted from an end surface (electron emission portion) 3a of the electron emission material 3 by heating the electron source 1 with the heater in a state where a high electric field is applied under vacuum.

(Electron Emission Material 3)

The electron emission material 3 releases the electrons by heating. Examples of the electron emission material 3 include rare earth borides such as lanthanum boride ($LaB_6$), cerium boride ($CeB_6$) and iridium cerium ($Ir_5Ce$). The work function and thermal emissivity of lanthanum boride are 2.8 eV and 0.77, respectively. The work function and thermal emissivity of cerium boride are 2.8 eV and 0.76, respectively. The work function and thermal emissivity of iridium cerium are 2.6 eV and 0.45, respectively.

In a case where the rare earth boride is used, it is preferable that the electron emission material 3 is a single crystal processed so that the <100> orientation, which has a low work function and is easy to emit the electrons, coincides with a direction of electron emission.

Figure 3A:
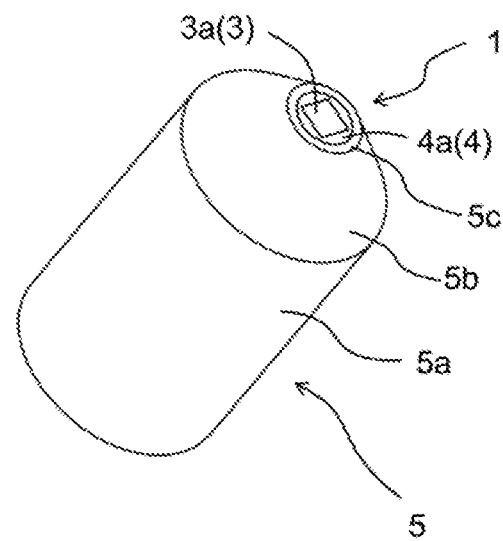
FIG. 3A shows a perspective view of an electron source 1 with an electron emission material 3 having a quadrangular prism shape.
Figure 3B:
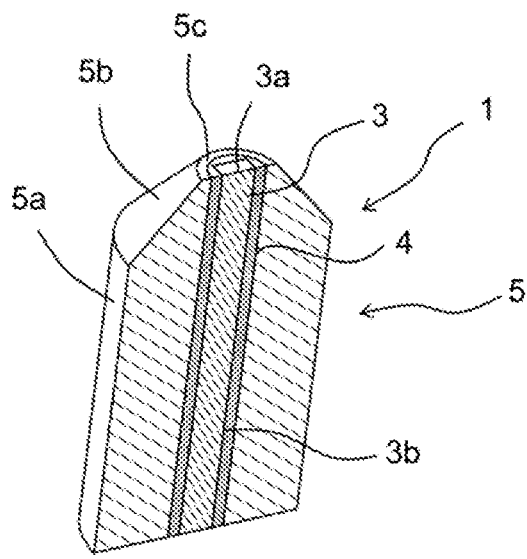
FIG. 3B is a cross-sectional view of the electron source 1 with the electron emission material 3 having the quadrangular prism shape passing through the center of the electron source 1.

The electron emission material 3 may be processed into a desired shape by electric discharge machining or the like. The shape of the electron emission material 3 is not particularly limited, and may be, for example, a columnar shape as shown in FIG. 1A or a quadrangular prism shape as shown in FIG. 3A. Length of the electron emission material 3 is preferably 0.2 to 3 mm, more preferably 0.5 to 1.5 mm, and still more preferably about 1 mm. In a case where the electron emission material 3 has the columnar shape, its diameter is preferably 0.02 to 0.3 mm, more preferably 0.05 to 0.15 mm, and still more preferably about 0.1 mm. In a case where the electron emission material 3 has the quadrangular prism shape, one side thereof is preferably 0.02 to 0.3 mm, more preferably 0.05 to 0.15 mm, and still more preferably about 0.1 mm. When the length of the electron emission material 3 is less than 0.2 mm, handling becomes worse, and when it is greater than 3 mm, it becomes difficult to raise temperature.

In any of the shapes, evaporation of the electron emission material 3 from the side surface 3b of the electron emission material 3 is suppressed by covering the side surface 3b of the electron emission material 3 with the electron emission-suppressing material 4. It is preferable that the electron emission-suppressing material 4 covers the entire circumference of the side surface 3b of the electron emission material 3.

Crystal orientation of the side surface 3b of the electron emission material 3 is not limited in general. However, since interatomic bonds on a lower index crystal plane are denser, it is considered that evaporation rate becomes slower. Thus, it is preferable that the electron emission material 3 has (100) crystal planes on the outer peripheral portion thereof by processing the electron emission material 3 so as to have the quadrangular prism shape and setting crystal orientations of its four side faces to (100).

(Electron Emission-Suppressing Material 4)

The work function of the electron emission-suppressing material 4 is higher than that of the electron emission material 3 and the thermal emissivity of the electron emission-suppressing material 4 is lower than that of the electron emission material 3. Since the work function of the electron emission-suppressing material 4 is higher than that of the electron emission material 3, emission of the electrons from the side surface 3b of the electron emission material 3 is suppressed by covering the side surface 3b of the electron emission material 3 with the electron emission-suppressing material 4. In addition, since the thermal emissivity of the electron emission-suppressing material 4 is lower than that of the electron emission material 3, the temperature rise of the electron emission material 3 is suppressed by covering the side surface 3b of the electron emission material 3 with the electron emission-suppressing material 4. In addition, it is preferable that the thermal emissivity of the electron emission-suppressing material 4 is lower than that of the support member 5. In such a case, the temperature rise of the electron emission material 3 is further suppressed.

Work function difference determined by (the work function of the electron emission-suppressing material 4)−(the work function of the electron emission material 3) is preferably 1.0 eV or more, more preferably 1.4 eV or more, still more preferably 1.6 eV or more. Thermal emissivity difference determined by (the thermal emissivity of the electron emission material 3)−(the thermal emissivity of the electron emission-suppressing material 4) is preferably 0.05 or more, more preferably 0.1 or more, further more preferably 0.2 or more, still more preferably 0.3 or more. In a case where the work function difference is less than a certain value, emission current from the side surface cannot be suppressed. Also, in a case where the emissivity is less than a certain value, evaporation-suppressing effect cannot be obtained.

The electron emission-suppressing material 4 preferably includes a refractory metal or a carbide thereof, more preferably includes at least one selected from the group consisting of metallic tantalum, metallic titanium, metallic zirconium, metallic tungsten, metallic molybdenum, metallic rhenium, tantalum carbide, titanium carbide and zirconium carbide. In addition, the electron emission-suppressing material 4 may include at least one of boron carbide and graphite. In addition, the electron emission-suppressing material 4 may include at least one of niobium, hafnium and vanadium.

The work function and thermal emissivity of each electron emission-suppressing material 4 are as shown in Table 1. The thermal emissivity of each material used in the present specification is quoted from "New Edition High Melting Compound Properties Handbook<Volume I>Japan-Soviet News Agency, 1994" and "Revised 2nd Edition Metal Data Book, Maruzen Co., Ltd., 1984."

TABLE 1

| Table 1 | Work function [eV] | Thermal emissivity |
|---|---|---|
| Metallic tantalum | 4.3 | 0.45 |
| Metallic titanium | 4.3 | 0.75 |
| Metallic zirconium | 4.0 | 0.32 |
| Metallic tungsten | 4.5 | 0.43 |
| Metallic molybdenum | 4.4 | 0.37 |
| Metallic rhenium | 4.9 | Unknown |
| Tantalum carbide | 3.2 | 0.65 |
| Titanium carbide | 3.3 | 0.94 |
| Zircon carbide | 3.4 | Unknown |
| Boron carbide | 5.2 | 0.85 |
| Graphite | 5.0 | 0.90 |
| Metallic niobium | 4.2 | 0.35 |
| Metallic hafnium | 3.9 | Unknown |
| Metallic vanadium | 4.4 | 0.34 |

When the electron emission-suppressing material 4 is a mixture of a plurality of the materials, overall work function and thermal emissivity of the electron emission limiting-material 4 is determined by volume ratios of all of the materials constituting the electron emission-suppressing material 4. For example, in a case where the electron emission-suppressing material 4 includes metallic tantalum and boron carbide and its volume ratio is 0.38:0.62, the overall work function is 4.3×0.38+5.2×0.62=4.86, and the overall thermal emissivity is 0.45×0.38+0.85×0.62=0.70. The volume ratio can be calculated from weight ratio and density.

It is preferable that all of the materials constituting the electron emission-suppressing material 4 have a higher work function than the electron emission material 3 and a lower thermal emissivity than the electron emission material 3. On the other hand, some of the materials constituting the electron emission-suppressing material 4 may have a lower work function than the electron emission material 3 or a higher thermal emissivity than the electron emission material 3. Even in such a case, it is essential that the overall work function of the electron emission-suppressing material 4 is higher than that of the electron emission material 3 and that the overall thermal emissivity of the electron emission-suppressing material 4 is lower than that of the electron emission material 3.

Shape of the electron emission-suppressing material 4 is preferably a thin film, and a thickness thereof is preferably 0.1 to 2 µm, more preferably 0.2 to 1 µm, and still more preferably 0.3 to 0.7 µm. In a case where the thickness is less than 0.1 µm or greater than 2 µm, problems such as peeling and poor adhesion may occur.

As shown in FIGS. 1A, 1B, 3A and 3B, the end surface 3a of the electron emission material 3 is on the same plane as an end surface 4a of the electron emission-suppressing material 4, and a normal to the plane is in the direction of the electron emission.

(Support Member 5)

In the present embodiment, the support member 5 is provided around the electron emission-suppressing material 4. Damage of the electron emission-suppressing material 4 is suppressed by providing the support member 5. The support member 5 is an arbitrary element and can be omitted if unnecessary.

Figure 2A:
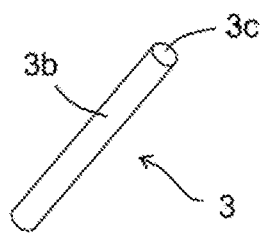
FIG. 2A shows a perspective view of an electron emission material 3 in the manufacturing process of the electron source 1.
Figure 2B:
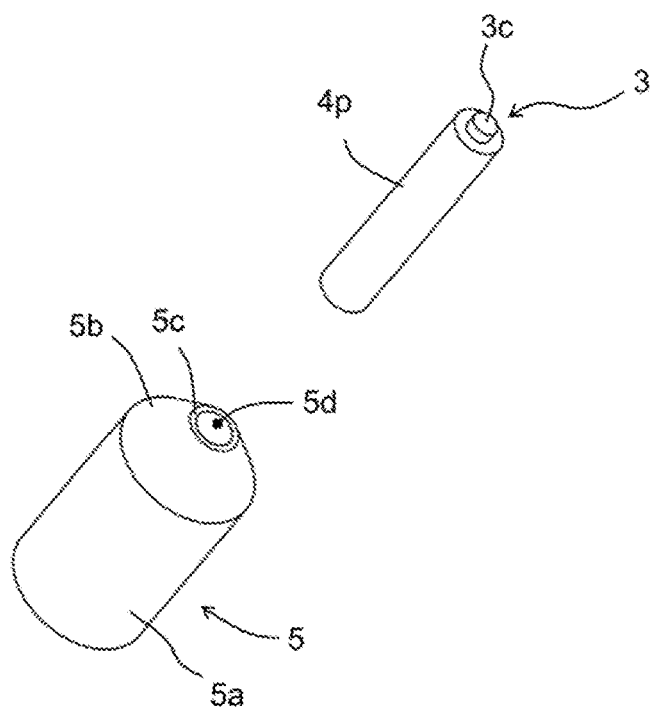
FIG. 2B is a perspective view showing a state where paste 4p containing an electron emission-suppressing material 4 is applied to a side surface 3b of the electron emission material 3 in the manufacturing process of the electron source 1.

As shown in FIG. 2B, the support member 5 has an opening 5d, and the support member 5 can be provided around the electron emission-suppressing material 4 by inserting the electron emission material 3 covered with the electron emission-suppressing material 4 into the opening 5d. The support member 5 is preferably provided so as to be closely attached to the electron emission-suppressing material 4, and more preferably provided so as to be closely attached to the entire circumference of the electron emission-suppressing material 4, resulting that a gap between the electron emission material 3 and the support member 5 is filled with the electron emission-suppressing material 4. In addition, since heat generated by the electron emission material 3 is promptly transmitted to the support member 5 through the electron emission-suppressing material 4, resulting in suppression of excessive temperature rise.

The support member 5 is preferably made of the graphite. Even when the thickness of the electron emission-suppressing material 4 is locally thinned by the support member 5 made of the graphite, the emission of the electrons from the side surface 3b of the electron emission material 3 is suppressed by the support member 5 because the graphite has a higher work function. Further, even when the thickness of the electron emission-suppressing material 4 is locally thinned, reaction of the electron emission material 3 with the support member 5 is suppressed because reactivity of the electron emission material 3 with the graphite is very low.

The support member 5 includes a side surface 5a, a tapered surface 5b, and an end surface 5c. The side surface 5a is connected with the end surface 5c via the tapered surface 5b, and the support member 5 tapers toward the end surface 5c. The end surface 5c is on the same plane as the end surface 3a and the end surface 4a.

2. Method for Manufacturing Electron Source 1

Next, a method of manufacturing the electron source 1 will be described. The electron source 1 can be produced by covering the side surface 3b of the electron emission material 3 with the electron emission-suppressing material 4. Examples of the methods include a method of forming the thin film of the electron emission-suppressing material 4 on the side surface 3b by vapor deposition (CVD or PVD) and a method of applying paste 4p containing the electron emission-suppressing material 4 to the side surface 3b of the electron emission material 3, and after that, solidifying the paste 4p. The latter method is excellent in that a manufacturing equipment is simple. The latter method will be described in detail below.

An example of a method for manufacturing the electron source 1 by paste application includes an applying step, an inserting step, a solidifying step, and a polishing step. In a case where the support member 5 is not provided, the inserting step is unnecessary. Also, the polishing step can be omitted.

(Applying Step)

As shown in FIGS. 2A to 2B, in the coating process, the paste 4p including the electron emission-suppressing material 4 is applied to the side surface 3b of the electron emission material 3. The paste 4p may be applied to the entire side surface 3b or may be applied to a portion of the side surface 3b other than a vicinity of an end part 3c as shown in FIG. 2B. It is preferable that the paste 4p is applied so as to have the thickness of the electron emission-suppressing material 4 described above after the solidifying step. In a case where the electron source 1 includes the support member 5, it is preferable that the paste 4p is applied to have a thickness capable of filling a gap between an inner surface of the opening 5d and an outer surface of the electron emission material 3.

The paste 4p can be prepared by dispersing powder of the electron emission-suppressing material 4 in a dispersion medium. As the dispersion medium, water, organic solvent and the like can be used, and the water is preferable.

The powder of the electron emission-suppressing material 4 may be composed of only powder of the refractory metal such as titanium, zirconium, tantalum, niobium, hafnium, vanadium, tungsten, molybdenum and rhenium, which may contain powder of the graphite or powder of ceramic such as metal carbide (e.g., boron carbide). The powder of ceramic is preferably 10 parts by volume or more and 200 parts by volume or less with respect to 100 parts by volume of metal powder as a solid content. In a case where blended amount of the ceramic powder is too large, bonding strength is lower. Conversely, in a case where the blended amount is too small, temporary adhesiveness before bonding is poor, which causes problems in workability.

(Inserting Step)

Figure 2C:
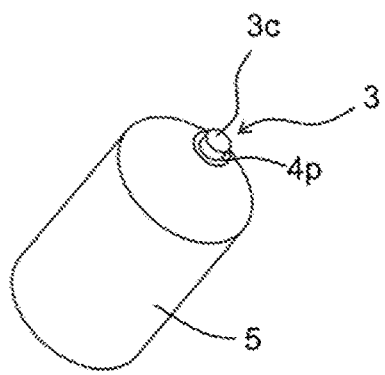
FIG. 2C is a perspective view showing a state where the electron emission material 3 having the applied paste 4p in the manufacturing process of the electron source 1 is inserted into an opening 5d of a support member 5.

As shown in FIGS. 2B to 2C, in the inserting step, the electron emission material 3 having the applied paste 4p is inserted into the opening 5d provided in the support member 5.

The opening 5d of the support member 5 can be formed by machining. Size of a cross section of the opening 5d is larger than that of the electron emission material 3. The size of the opening 5d is, for example, 0.15 mm in diameter×0.8 mm in depth.

When the electron emission material 3 is inserted into the opening 5d in a state where the paste 4p is not applied, a gap is generated between the outer surface of the electron emission material 3 and the opening 5d, resulting in non-fixed state. On the other hand, when the electron emission material 3 having the applied paste 4p is inserted into the opening 5d, the gap is filled with the paste 4p.

As shown in FIG. 2C, it is preferable that the end part 3c of the electron emission material 3 protrudes from the support member 5 in a state where the electron emission material 3 is inserted in the opening 5d.

(Solidifying Step)

Figure 2D:
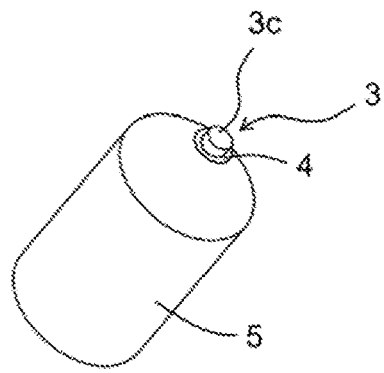
FIG. 2D is a perspective view showing a state where a thin film of the electron emission-suppressing material 4 formed by solidifying the paste 4p covers the electron emission material 3 in the manufacturing process of the electron source 1.

Next, as shown in FIGS. 2C to 2D, in a state where the electron emission material 3 having the applied paste 4p is inserted in the opening 5d, the paste 4p is solidified by performing a vacuum heat treatment, resulting that the thin film of the electron emission-suppressing material 4 is coated on the electron emission material 3. Further, by solidifying the paste 4p, the electron emission material 3 and the electron emission-suppressing material 4 can be fixed to the support member 5.

(Polishing Step)

Next, the end part 3c of the electron emission material 3 is polished using a polishing member such as polishing paper or lapping film By doing so, the end surface 3a of the electron emission material 3, the end surface 4a of the electron emission-suppressing material 4, and the end surface 5c of the support member 5 are on the same plane, and the electron source 1 shown in FIG. 1A is obtained.

EXAMPLES

1. Manufacture of Electron Source 1

Example 1

As an electron emission material 3, a cylindrical rod having a shape of a diameter of 0.1 mm×a height of 1 mm with a longitudinal axis of <100> direction was produced from a single crystal of lanthanum boride by electric discharge machining. It was difficult to limit crystal orientation of side surface thereof, but it was about 45 degrees off (100).

Next, high-purity graphite having a quadrangular prism shape of 0.7 mm×0.7 mm×1.2 mm was prepared and then an end part thereof was sharpened by machining to prepare a support member 5. An opening 5d having a diameter of 0.15 mm×a depth of 0.8 mm was formed in the longitudinal direction of the support member by machining.

Paste 4p obtained by dissolving tantalum powder as an electron emission-suppressing material 4 with water was applied to a side surface 3b of the electron emission material 3. Then, the electron emission material 3 having the applied paste 4p was inserted into the opening 5d of the support member 5.

Heater blocks were prepared by cutting pyrolytic graphite into a size of 0.7 mm×0.7 mm×0.7 mm. Then, the support member 5 sandwiched between the heater blocks using a support pole while applying pressure was assembled.

In such assembled state, current was applied under vacuum of $10^{-5}$ Pa, and held at 1600° C. for 2 minutes to solidify paste 4p. Thereby, a structure in which the electron emission material 3 covered with the electron emission-suppressing material 4 was inserted in the opening 5d was obtained. In this structure, as shown in FIG. 2D, the end part 3c of the electron emission material 3 protruded from the support member 5.

Next, the support member 5 was detached from the support pole, and the end part 3c of the electron emission material 3 was polished with abrasive paper so that an end surface 3a of the electron emission material 3, an end surface 4a of the electron emission-suppressing material 4, and an end surface 5c of the support member 5 were on the same plane. Thereby, an electron source 1 in a state where the electron emission material 3 is coaxially surrounded by the electron emission-suppressing material 4 and the support member 5 was obtained.

Examples 2 to 3

Each of electron source 1 was produced in the same manner as in Example 1 except that powder obtained by mixing tantalum powder and boron carbide (product name: Denka Boron Carbide #1000) at a volume ratio shown in Table 2 was used as the electron emission-suppressing material 4 instead of the tantalum powder and that the temperature at which the paste 4p was solidified was changed to 1550° C.

Example 4

An electron source 1 was obtained in the same manner as in Example 1 except that cerium boride was used as the electron emission material 3 instead of lanthanum boride.

Example 5

As an electron emission material 3, a side surface of a single crystal of lanthanum boride with a longitudinal axis of <100> direction was subjected to electric discharge machining to produce a quadrangular prism shaped rod having a height of 0.1 mm, a width of 0.1 mm, and a length of 1 mm. The electric discharge machining was performed so that a (100) crystal planes were at an outer peripheral portion of the electron emission material.

Thereafter, a thin film of tantalum having a thickness of about 0.5 µm was formed on the surface of the electron emission material 3 by CVD method. Next, colloidal carbon paste was applied to a side surface 3b of the electron emission material 3, and then an electron source 1 was produced under the same conditions as in Example 2.

Examples 6 to 7

Each of electron sources 1 was produced in the same manner as in Example 5 except that a metal of a type shown in Table 2 was used instead of tantalum.

Comparative Example 1

An electron source 1 was produced by the same process as in Example 1 except that only colloidal carbon was used as a paste.

Comparative Example 2

An electron source 1 was produced by the same process as in Example 4 except that only colloidal carbon was used as a paste.

Comparative Example 3

An electron source 1 was produced by the same process as in Example 1 except that powder obtained by mixing tantalum powder and boron carbide at a volume ratio shown in Table 2 was used as the electron emission-suppressing material 4 instead of tantalum powder.

2. Evaluation of Electron Source 1

Each of the electron source 1 was attached to the support pole and sandwiched between graphite heaters. In order to evaluate heat resistance, each of the electron source 1 was continuously heated for two weeks at 1550° C. being temperature at normal operation under vacuum of $10^{-5}$ Pa, and then taken out. Next, consumption state of an outer peripheral portion of each of the electron emission material 3 was observed from the end surface 3a by a scanning type electron microscope, and then the remaining diameter of the end surface 3a which is the electron emission portion was measured. The results are shown in Table 2.

As shown in Table 2, in Examples 1 to 7, the remaining diameter of each of the electron emission portion was larger than that of each of Comparative Examples 1 to 3. In Examples 1 to 7, consumption of the outer peripheral portion of each of the electron emission material 3 was hardly observed, but in Comparative Examples 1 to 3, consumption of the outer peripheral portion of each of the electron emission material 3 was conspicuous.

In all Examples and Comparative Examples, a work function of each of the electron emission-suppressing material 4 was higher than that of the respective electron emission material 3. On the other hand, in Examples 1 to 7, a thermal emissivity of each of the electron emission-suppressing material 4 was lower than that of the respective electron emission material 3 whereas, in Comparative Examples 1 to 3, a thermal emissivity of each of the electron emission-suppressing material 4 was higher than that of the respective electron emission material 3.

The above results demonstrate that the consumption of the electron emission material 3 can be prevented by covering the side surface 3b of the electron emission material 3 with the electron emission-suppressing material 4 having the higher work function than the electron emission material 3 and having the lower thermal emissivity than the electron emission material 3.

TABLE 2

| | | Electron emission material | | | Electron emission-suppressing material | | | |
|---|---|---|---|---|---|---|---|---|
| | | Type | Work function [eV] | Crystal orientation of side surface [off (100)] | Thermal emissivity | Type | Volume ratio | Work function of each material [eV] | Overall work function [eV] |
| Example | 1 | LaB$_6$ | 2.8 | 45 degrees | 0.77 | Ta | 1.00 | 4.3 | 4.3 |
| | 2 | LaB$_6$ | 2.8 | 45 degrees | 0.77 | Ta | 0.38 | 4.3 | 4.86 |
| | | | | | | B$_4$C | 0.62 | 5.2 | |
| | 3 | LaB$_6$ | 2.8 | 45 degrees | 0.77 | TaC | 0.53 | 3.2 | 4.14 |
| | | | | | | B$_4$C | 0.47 | 5.2 | |
| | 4 | CeB$_6$ | 2.8 | 45 degrees | 0.76 | Ta | 1.00 | 4.3 | 4.3 |
| | 5 | LaB6 | 2.8 | 0 degree | 0.77 | Ta | 1.00 | 4.3 | 4.3 |
| | 6 | LaB6 | 2.8 | 0 degree | 0.77 | Ti | 1.00 | 4.3 | 4.3 |
| | 7 | LaB6 | 2.8 | 0 degree | 0.77 | W | 1.00 | 4.5 | 4.5 |
| Comparative Example | 1 | LaB$_6$ | 2.8 | 45 degrees | 0.77 | C | 1.00 | 5.0 | 5 |
| | 2 | CeB$_6$ | 2.8 | 45 degrees | 0.76 | C | 1.00 | 5.0 | 5 |
| | 3 | LaB$_6$ | 2.8 | 45 degrees | 0.77 | Ta | 0.13 | 4.3 | 5.08 |
| | | | | | | B$_4$C | 0.87 | 5.2 | |

| | | Electron emission-suppressing material | | Work function difference [eV] | Thermal emissivity difference | Heat resistance evaluation Remaining diameter of electron emission portion [µm] |
|---|---|---|---|---|---|---|
| | | Thermal emissivity of each material | Overall Thermal emissivity | | | |
| Example | 1 | 0.45 | 0.45 | 1.50 | 0.32 | 70 |
| | 2 | 0.45 0.85 | 0.70 | 2.06 | 0.07 | 65 |

TABLE 2-continued

|  |  | 3 | 0.65 0.85 | 0.74 | 1.34 | 0.03 | 60 |
|---|---|---|---|---|---|---|---|
|  |  | 4 | 0.45 | 0.45 | 1.50 | 0.31 | 70 |
|  |  | 5 | 0.45 | 0.45 | 1.50 | 0.32 | 83 |
|  |  | 6 | 0.75 | 0.75 | 1.50 | 0.02 | 66 |
|  |  | 7 | 0.43 | 0.43 | 1.70 | 0.34 | 83 |
| Comparative | | 1 | 0.90 | 0.90 | 2.20 | −0.13 | 40 |
| Example | | 2 | 0.90 | 0.90 | 2.20 | −0.14 | 40 |
|  |  | 3 | 0.45 0.85 | 0.80 | 2.28 | −0.03 | 48 |

EXPLANATION OF SIGNS

1: Electron source
3: Electron emission material
3a: End surface
3b: Side surface
3c: End part
4: Electron emission-suppressing material
4a: End surface
4p: Paste
5: Support member
5a: Side surface
5b: Tapered surface
5c: End surface
5d: Opening

What is claimed is:

1. An electron source comprising:
   an electron emission material; and,
   an electron emission-suppressing material covering a side surface of the electron emission material,
   wherein a work function of the electron emission-suppressing material is higher than that of the electron emission material, and
   a thermal emissivity of the electron emission-suppressing material is lower than that of the electron emission material,
   wherein an end surface of the electron emission material is on the same plane as an end surface of the electron emission-suppressing material, and a normal to the plane is in a direction of emission of electrons.

2. The electron source according to claim 1, wherein the electron emission material comprises at least one selected from the group consisting of lanthanum boride, cerium boride and iridium cerium.

3. The electron source according to claim 1, wherein the side surface of the electron emission material has a (100) crystal plane at an outer peripheral portion thereof.

4. The electron source according to claim 1, wherein the electron emission-suppressing material comprises at least one selected from the group consisting of metallic tantalum, metallic titanium, metallic zirconium, metallic tungsten, metallic molybdenum, metallic rhenium, tantalum carbide, titanium carbide and zirconium carbide.

5. The electron source according to claim 1, wherein shape of the electron emission-suppressing material is a thin film.

6. The electron source according to claim 5, wherein the thin film has a thickness of 0.1 to 2 μm.

7. The electron source according to claim 1, further comprising a support member around the electron emission-suppressing material.

8. The electron source according to claim 7, wherein the support member is closely attached to the electron emission-suppressing material.

9. The electron source according to claim 7, wherein the support member is made of graphite.

10. A method for manufacturing an electron source according to claim 1, comprising an applying step and a solidifying step,
    wherein, in the applying step, paste containing electron emission-suppressing material is applied to a side surface of an electron emission material, and
    in the solidifying step, the paste is solidified.

11. The method according to claim 10, further comprising an inserting step between the applying step and the solidifying step, wherein, in the inserting step, the electron emission material having the applied paste is inserted into an opening provided in a support member.

* * * * *